(12) United States Patent
Aizpuru

(10) Patent No.: US 7,652,244 B2
(45) Date of Patent: Jan. 26, 2010

(54) COMBINED LASER TRANSMITTER AND PHOTODETECTOR RECEIVER PACKAGE

(75) Inventor: Jose Joaquin Aizpuru, Murphy, TX (US)

(73) Assignee: Finisar Corporation, Sunnyvale, CA (US)

( * ) Notice: Subject to any disclaimer, the term of this patent is extended or adjusted under 35 U.S.C. 154(b) by 0 days.

(21) Appl. No.: 11/101,884

(22) Filed: Apr. 8, 2005

(65) Prior Publication Data

US 2006/0071150 A1  Apr. 6, 2006

Related U.S. Application Data

(60) Provisional application No. 60/615,905, filed on Oct. 5, 2004.

(51) Int. Cl.
*G06M 7/00* (2006.01)
*H01J 40/14* (2006.01)
*G01N 21/86* (2006.01)
*H01L 31/00* (2006.01)
*H01L 27/15* (2006.01)

(52) U.S. Cl. ............... 250/221; 250/239; 250/559.4; 250/214.1; 257/82

(58) Field of Classification Search ............... 250/221, 250/214 R, 214.1, 559.4, 216, 222.1, 239, 250/227.22, 551; 257/80, 81, 82, 432, 433, 257/462, 83, 84, 98, 465, 431; 372/21, 50.124; 356/132, 136, 139.05, 139.06; 362/362, 362/544, 546; 385/14, 15, 39

See application file for complete search history.

(56) References Cited

U.S. PATENT DOCUMENTS

| | | | | | |
|---|---|---|---|---|---|
| 3,697,762 | A | * | 10/1972 | Kurtz | 250/239 |
| 4,309,605 | A | * | 1/1982 | Okabe | 250/239 |
| 5,466,954 | A | * | 11/1995 | Aizpuru et al. | 257/187 |
| 5,790,728 | A | * | 8/1998 | Wentworth | 385/39 |
| 6,235,141 | B1 | * | 5/2001 | Feldman et al. | 156/250 |
| 6,586,721 | B2 | * | 7/2003 | Estevez-Garcia | 250/221 |
| 6,596,986 | B1 | * | 7/2003 | Sano et al. | 250/239 |
| 6,740,862 | B2 | * | 5/2004 | Paritsky et al. | 250/221 |
| 6,794,633 | B2 | * | 9/2004 | Iwasaki | 250/221 |
| 7,286,581 | B2 | * | 10/2007 | Coleman | 372/21 |
| 2006/0043278 | A1 | * | 3/2006 | Schelp et al. | 250/239 |

FOREIGN PATENT DOCUMENTS

KR  10-2007-7007804  2/2008

\* cited by examiner

*Primary Examiner*—Georgia Y Epps
*Assistant Examiner*—Don Williams
(74) *Attorney, Agent, or Firm*—Workman Nydegger

(57) ABSTRACT

Reflective optical sensors. A reflective optical sensor for sensing the presence of an object can include a reflective sensor package having a first cavity and a second cavity. The first and second cavities can be located side-by-side in the sensor package. A vertical cavity surface emitting laser (VCSEL) can be located within the first cavity for producing an optical emission. An optical receiver can be located within the second cavity and configured to receive at least a portion of the produced optical emission that is reflected from the object such that when the reflected emission is above a threshold strength the object is determined to be present. The optical receiver can be a shunt phototransistor and can include reverse bias protection.

14 Claims, 4 Drawing Sheets

COMBINED LASER TRANSMITTER AND PHOTODETECTOR RECEIVER PACKAGE

CROSS-REFERENCE TO RELATED APPLICATIONS

This application claims the benefit of U.S. Provisional Patent Application No. 60/615,905 entitled "Combined Laser Transmitter and Photodetector Receiver Package" filed Oct. 5, 2004, the contents of which is hereby incorporated by reference.

BACKGROUND OF THE INVENTION

1. The Field of the Invention

The present invention relates generally to optical sensors. More specifically, the present invention relates to reflective optical sensors for sensing the presence and absence of an object.

2. The Relevant Technology

Optical sensors are used in a wide variety of applications. One application where optical sensors are of particular use is to detect the presence and absence of an object. Two types of optical sensors that detect the presence and absence of an object are interrupt optical sensors and reflective optical sensors.

Interrupt optical sensors include an optical emitter and an optical receiver located on opposite sides of an object to be sensed. The presence of the object is indicated when the object breaks the optical link between the optical emitter and the optical receiver. The absence of the object is indicated when the optical transmission of the optical receiver is received by the optical emitter.

Reflective optical sensors can include an optical emitter and an optical receiver located on the same side of an object to be sensed. The presence of the object is indicated when an optical emission from the optical emitter is reflected from the surface of the object and is received by the optical receiver.

Reflective optical sensors can present several advantages over interrupt optical sensors. Reflective optical sensors are advantageous because both the optical transmitter and the optical receiver are located in a single package. A single package can eliminate additional screws, brackets, packaging, and shipping costs related to a two package interrupt sensor design. In addition, a reflective optical sensor may be relatively small in size, and more adaptable to a greater variety of placements because it is in a single package. The optical transmitter and receiver of the reflective optical sensor is also typically aligned during manufacturing, rather than on-site by the consumer often preventing misalignment by the consumer.

Conventional reflective optical sensors typically include a light emitting diode ("LED") and an optical receiver (e.g. a photodiode or a phototransistor) mounted within side-by-side cavities in a sensor housing. The cavities must be of a sufficient depth to prevent undesirable cross talk between the LED and the optical receiver when an object is not present. Although this typical reflective optical sensor has been implemented in a number applications, it nonetheless presents a number of limitations.

Conventional reflective optical sensors using a LED emitter are limited in the concentration of light emitted from the LED resulting in a relatively short distance at which they can sense an object. LEDs also have a broad angular emission window projected in a large undefined angular range similar to a conventional light bulb. In certain applications, this results in low intensity of reflected light, excessive cross talk, lower resolution, and less accurate detection of the presence and absence of an object.

In addition, a conventional reflective optical receiver using typical photodiodes and photo transistors may have a low contrast ratio that may not be as sensitive to changes in illumination where fairly small changes in illumination are expected. Typical photodiodes and photo transistors may also detect certain low levels of light interference falsely indicating the presence of an object. In addition, typical photodiodes and photo transistors can operate in a substantially linear relationship between incident light intensity and photocurrent produced. As a result, typical photodiodes and photo transistors may produce interference current signals at low light levels supplying a less accurate and potentially false indication of the presence of an object.

BRIEF SUMMARY OF THE INVENTION

The present invention relates to reflective sensors. A reflective optical sensor for sensing the presence of an object is described. The sensor can include a reflective sensor package including a first cavity and a second cavity, the first and second cavities can be located side-by-side in the sensor package. A vertical cavity surface emitting laser (VCSEL) can be located within the first cavity for producing an optical emission. An optical receiver can be located within the second cavity and configured to receive at least a portion of the produced optical emission that is reflected from the object such that when the reflected emission is above a threshold strength the object is determined to be present.

A reflective optical sensor is described. The sensor can include a sensor package including a first cavity, a second cavity located next to the first cavity, a laser located within the first cavity for producing an optical emission, and a shunt phototransistor located in the second cavity for receiving a reflection of the optical emission from an object being sensed.

A reflective optical sensor for sensing the presence of an object is described. The sensor can include a reflective sensor package made of a resilient plastic material. The sensor package can include a first cavity and a second cavity. The second cavity can be located next to the first cavity in the sensor package. A VCSEL can be located within the first cavity for producing an optical emission. A shunt phototransistor including reverse bias protection can be located within the second cavity and can be configured to receive at least a portion of the produced optical emission reflected off of the object. The shunt phototransistor can include reverse bias protection. The shunt phototransistor can include an emitter, a collector, a base, a diode including an anode and a cathode, the anode being electrically coupled with the base and the cathode being electrically coupled with the collector, a shunt internal resistor electrically coupled between the anode and the emitter creating a PN junction relationship, the PN junction relationship being disposed in parallel electrical relationship with the diode and the first resistor, and a bias protection internal resistor coupled in electrical communication between the first resistor and the emitter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE PREFERRED EMBODIMENTS

The principles of the present invention are described with reference to the attached drawings to illustrate the structure and operation of example embodiments used to implement the present invention. Using the diagrams and description in this manner to present the invention should not be construed as limiting its scope. Additional features and advantages of the invention will in part be obvious from the description, including the claims, or may be learned by the practice of the invention.

Figure 1:
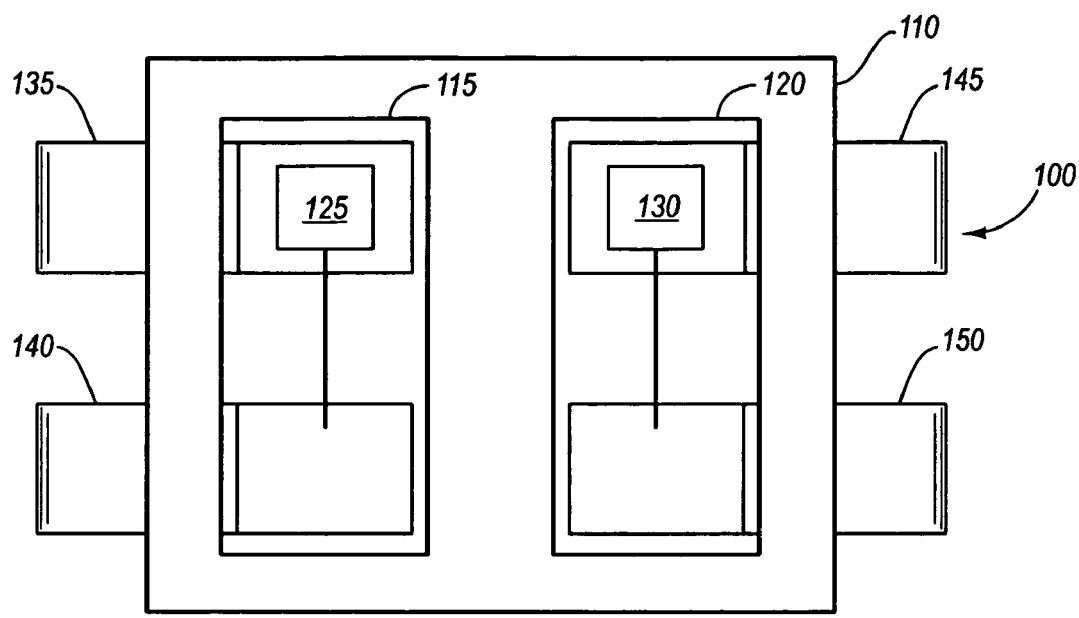
FIG. 1 illustrates a reflective sensor for sensing the presence and absence of an object according to an example embodiment of the present invention.

FIG. 1 illustrates a reflective sensor 100 for sensing the presence and absence of an object according to an example embodiment of the present invention. As shown, the reflective sensor 100 comprises a reflective sensor package 110. The reflective sensor package 110 can include a first cavity 115 and a second cavity 120 located in a side-by-side arrangement. The first cavity 115 can include a laser 125 (e.g. an edge emitting laser or a vertical cavity surface emitting laser ("VCSEL")) for producing an optical emission. The second cavity 120 can include an optical receiver 130 (e.g. a photodiode or phototransistor) for receiving a portion of the optical emission reflected from an object.

The laser 125 can be located above a first electrical contact 135. The laser 125 can be electrically coupled to both the first electrical contact 135 and a second electrical contact 140. Similarly, the optical receiver 130 can be located above a third electrical contact 145, and the optical receiver 130 can be electrically coupled to both the third electrical contact 145 and a fourth electrical contact 150. It should be understood that the arrangement of the components shown in FIG. 1 is merely an example embodiment. It would be apparent to one of ordinary skill in the art, after having reviewed this description, that other component arrangements are included within the scope of the present invention.

Figure 2:
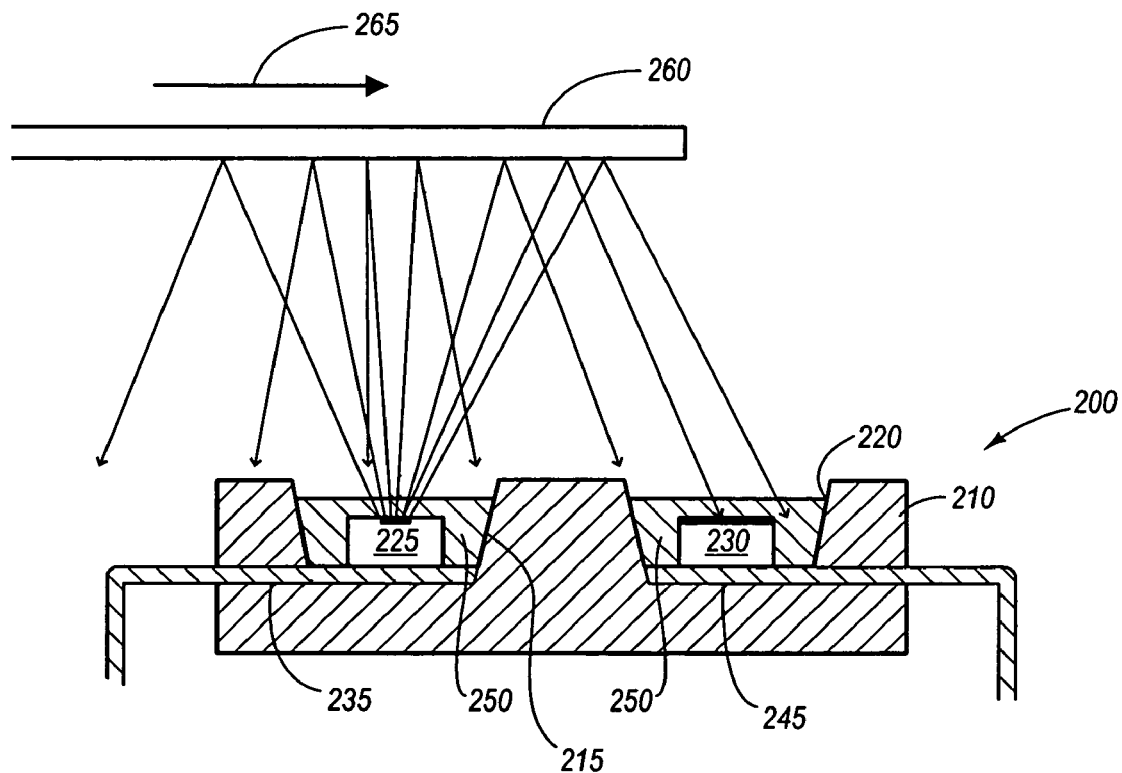
FIG. 2 illustrates a side operational cross-sectional view of a reflective sensor according to an example embodiment of the present invention.

For example, FIG. 2 depicts a reflective sensor 200 including a laser, in this case a VCSEL 225, and an optical receiver, in this case a phototransistor 230, in opposing cavities according to an example embodiment of the present invention. The reflective sensor 200 can include a package 210 made of a resilient plastic material having a first cavity 215 and a second cavity 220. The VCSEL 225 can be located in the first cavity 215 above a first electrical contact 235. The VCSEL 225 can be electrically coupled to the first contact 235 by an electrical connection and a second electrical contact (not visible, for example, similar to contact 140 depicted in FIG. 1). Similarly, a phototransistor 230 can be located in the second cavity 220 above a third electrical contact 245. The phototransistor 230 can be electrically coupled to both the third electrical contact 245 and a fourth electrical contact (not visible, for example, similar to contact 150 depicted in FIG. 1). According to the example embodiment shown in FIG. 2, the first cavity 215 and the second cavity 220 can be filled by an at least partially transparent resin material 250 allowing for transmission of light to and from the VCSEL 225 and phototransistor 230, while providing protection for these active optical devices and their electrical connections.

In operation, an object 260 to be sensed is located above the reflective sensor 200. The object 260 can be any object and can be traveling across the emission window of the VCSEL 225 as indicated by arrow 265, such as, for example, in the case of a sheet of paper in an automatic teller machine ("ATM") or a printer. The VCSEL 225 produces an optical emission in the direction of the object 260. At least a portion of the optical emission is reflected from the surface of the object 260 and is received by the phototransistor 230. Upon receiving the reflected emission, the phototransistor 230 produces a light current output, which can be transmitted to the fourth electrical connector electrically coupled to the phototransistor 230. The reflective sensor 200 shown in FIG. 2 can be at least as small as about 3 millimeters square or larger depending on the application.

Using a VCSEL to produce the optical emission according to this example embodiment of the present invention has several advantages over conventional reflective sensors using a LED. For example, a VCSEL emits a more concentrated light, which allows for a greater distance between the reflective sensor and the object to be sensed. The concentrated light emission of the VCSEL also results in more concentrated light reception by the phototransistor. This may allow for placement of the sensor in locations not ordinarily available using a LED, such as for example, at further distances from an object being sensed or in dirty or hazardous environments. In addition, the concentrated emission of a VCSEL emitter may also allow for sensing an object having a surface that would not provide sufficient reflection of the less concentrated light of a LED.

A VCSEL also produces a more defined emission of light than a LED. Typically, a VCSEL creates an emission having an angular emission window of about 20-30 degrees. A LED, on the other hand, creates an emission without a well defined emission window (e.g. approaching 180 degrees). The VCSEL emission, therefore, creates less cross-talk between the VCSEL and the phototransistor. The well defined VCSEL emission also results in a more defined reflection from the object thereby allowing for higher resolution and more accurate detection of the object. The well defined VCSEL emission may also be produced in a particular angular direction allowing for a greater directional reflection and more particular tailoring of the sensor for a particular application or distance between the sensor and the object to be sensed.

Using a VCSEL according to embodiments of the present invention also has particular advantages in some applications over embodiments using conventional edge-emitting lasers. For example, VCSELs have a surface-normal emission, and geometry similar to that of a photodetector allowing for easy alignment and packaging in the reflective sensor of example embodiments of the present invention. VCSELs may also have a low threshold currents enabling high-density arrays of VCSELs, which may be advantageous for certain applications of embodiments of the present invention implementing arrays of VCSELs or photodetectors in a sensor. VCSELs also have circular and low divergence output beams that may eliminate the need for corrective optics and may allow for low cost and predictable alignment. VCSELS are also characterized by lower temperature sensitivity and low power consumption potentially allowing for additional applications and placements according to certain embodiments of the present invention.

Figure 3:
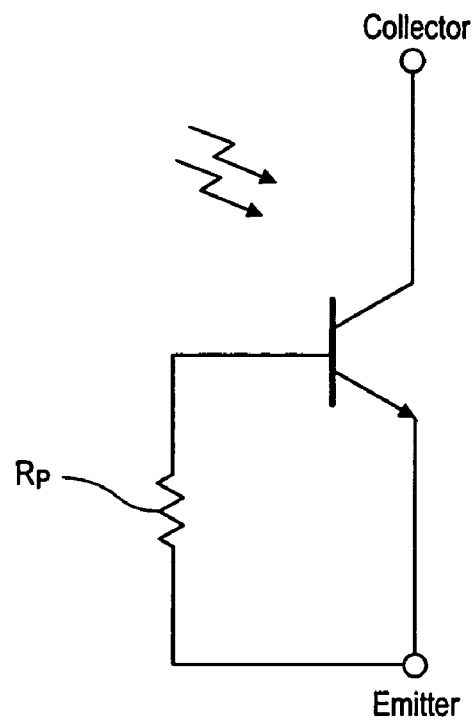
FIG. 3 illustrates an electrical schematic of a shunt phototransistor according to an aspect of an example embodiment of the present invention.

According to another example embodiment of the present invention, the phototransistor 230 shown in FIG. 2 can be a shunt phototransistor. FIG. 3 illustrates a schematic of a shunt phototransistor. A shunt phototransistor is a phototransistor with internal base-emitter shunt resistance. The shunt phototransistor includes a first resistor $R_p$. The resistor $R_p$ may be an internal resistor that is formed by doping a region of $P^+$ conductivity type material in a portion of the N conductivity type semiconductive material.

Figure 4:
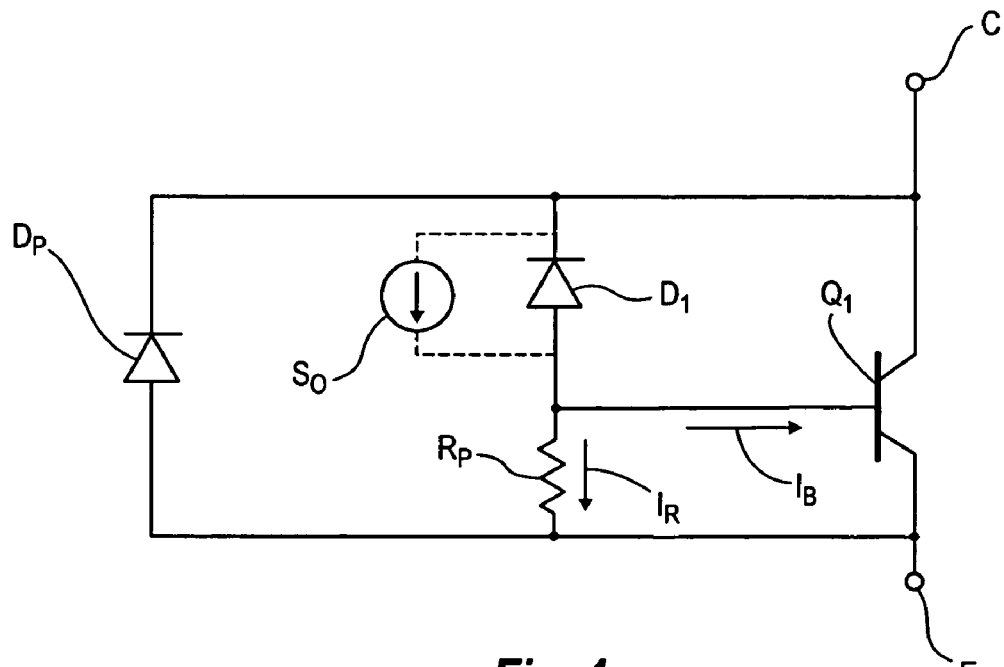
FIG. 4 illustrates an electrical schematic of a shunt phototransistor according to an aspect of an example embodiment of the present invention.

Referring to FIG. 4, another schematic of a shunt phototransistor is shown. The phototransistor $Q_1$ includes a base, an emitter, and a collector. A diode $D_1$ is formed by a junction between N conductivity type material and $P^+$ conductivity type material and a photocurrent $S_o$ is created when light is imposed on the diode D1. A resistor $R_p$ is formed by doping a second region of $P^+$ conductivity type material in a portion of N conductivity type semiconductive material. The junction relationship between the N conductivity type material and the second region of $P^+$ conductivity type material provides a diode relationship that is represented by diode $D_p$, which is a parasitic diode that is formed by the structure of the first resistor $R_p$.

Figure 5:
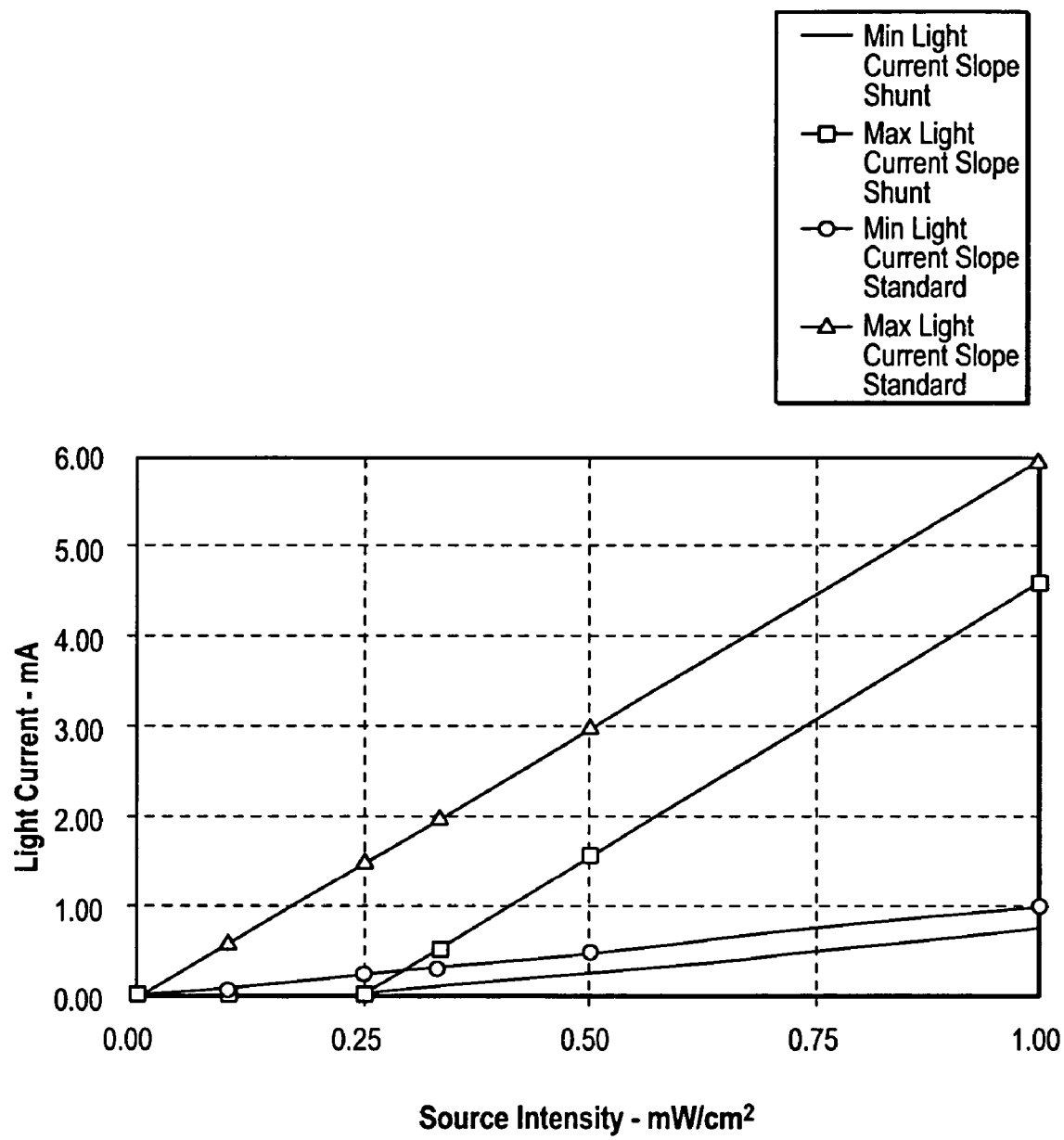
FIG. 5 illustrates the light current output of the shunt phototransistor as compared to a standard phototransistor with similar sensitivity according to an aspect of an example embodiment of the present invention.

The shunt phototransistor incorporates all of the desired features of a standard phototransistor with the added advantage of low level light rejection. The phototransistor switching occurs when the light from the VCSEL reflected off of the object increases above a threshold ("knee point"). When the light level exceeds the knee point of the shunt phototransistor, it will function as a standard phototransistor. FIG. 5 illustrates the light current output of an example shunt phototransistor as compared to a standard phototransistor with similar sensitivity. FIG. 5 depicts the specified limits of light current slope for the example shunt phototransistor with a slope beginning at a knee point of 0.25 mW/cm². Light current slopes for high and low gain and standard phototransistors are shown for comparison. Note that for phototransistors of the same gain, the slopes are the same.

The shunt phototransistor may have different knee points and light current slopes. The light current slope is the change in light current output divided by the change in source irradiances defined by Equation 1 as follows:

$$I_L \text{Slope} = [I_{L1}(@H_1) - I_{L2}(@H_2))]/[H_1 - H_2] \quad (1)$$

where:
 $I_L$ slope is the light current slope in mA/mW/cm²;
 $I_L$ is the light current output in mA; and
 H is the source intensity in mW/cm².

The knee point (e.g. the source irradiance needed to increase $I_L$ to 50 uA in this instance but subject to change based on the value of $R_p$) is another parameter of the phototransistor circuit design. Variation in the knee point is offset by the internally guardbanded light current slope limits and an appropriate formula for circuit design is defined by Equation 2 as follows:

$$I_L = I_L \text{slope}_{min} * (H_A - H_{KP}) \quad (2)$$

where:
 $I_L$ is the light current output in mA;
 $I_L$ slope$_{min}$ is the minimum limit on the light current slope (i.e. 4.0 mA/mW/cm²);
 $H_A$ is the source light incident on the detector for the application; and
 $H_{KP}$ is the specified level of source light incident on the detector at the typical knee point (e.g. 0.25 mW/cm²).

The present example embodiments incorporating a shunt phototransistor can be particularly well suited for environments where an ambient light or other low level light conditions are present. The shunt phototransistor further provides high contrast ratio where unwanted background reflection or other low level interference is a possibility. The high contrast ratio is particularly advantageous when coupled with the particularly well defined emission of a VCSEL, as compared to a LED, giving an almost "digital" type response to the presence of an object in certain instances.

Figure 6:
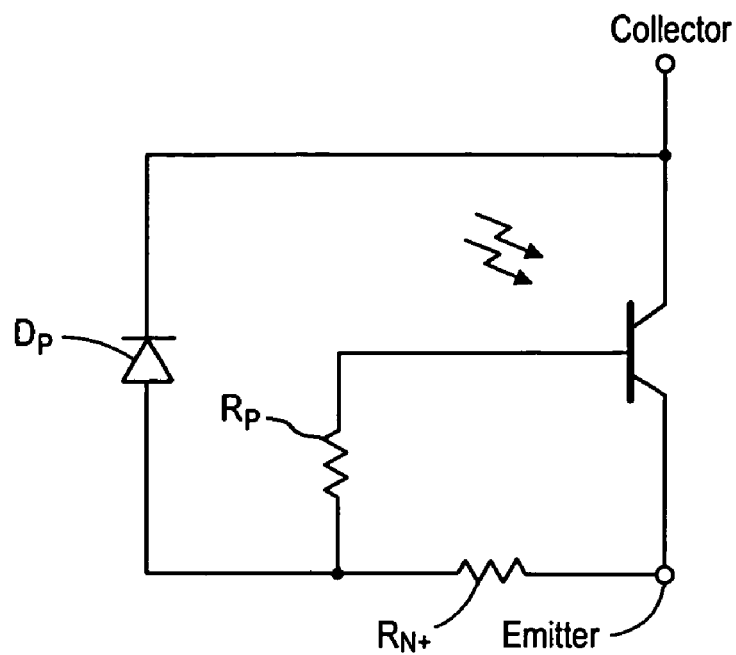
FIG. 6 illustrates a schematic of a shunt phototransistor with reverse bias protection according to an aspect of an example embodiment of the present invention.

According to another example embodiment of the present invention, the phototransistor 230 shown in FIG. 2 can be a shunt phototransistor with reverse bias protection. A schematic of a shunt phototransistor with reverse bias protection is illustrated in FIG. 6. As shown, a phototransistor can be provided with a first resistor $R_p$ that operates as a shunt resistor, and a second resistor $R_{N+}$ that operates to protect the device from damage that may be caused by a reverse bias condition.

Figure 7:
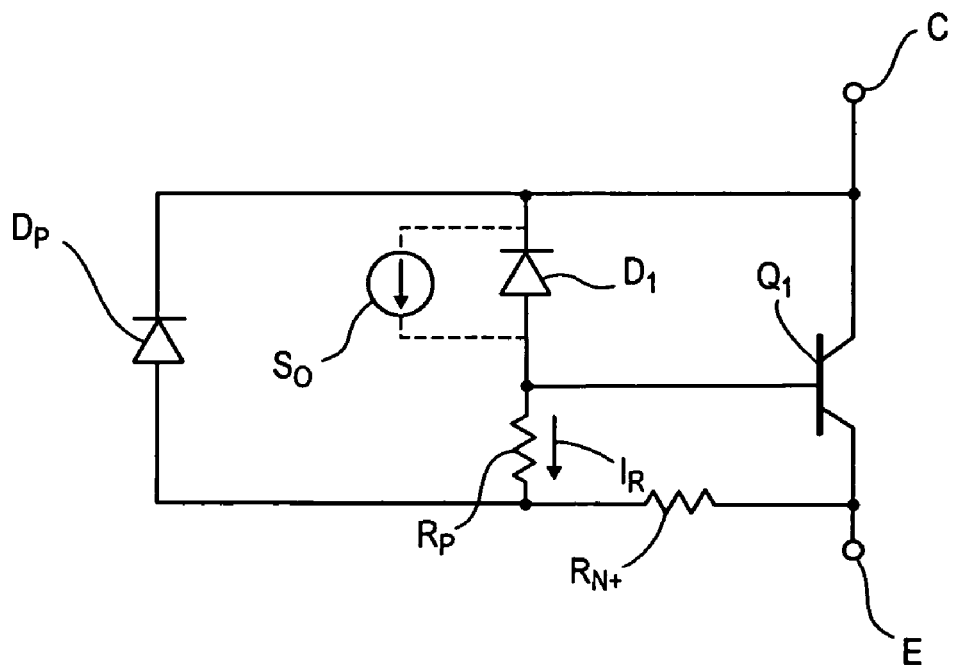
FIG. 7 illustrates a schematic of a shunt phototransistor with reverse bias protection according to an aspect of an example embodiment of the present invention.

Referring now to FIG. 7, another schematic of a shunt phototransistor with reverse bias protection is shown. The first resistor $R_p$ can be provided in a manner described above in conjunction with FIG. 4. In addition, a second resistor $R_{N+}$ can also be connected between the emitter E of transistor $Q_1$ and the parasitic diode $D_p$. The presence of the parasitic diode $D_p$ creates a current path between the emitter terminal and collector terminal of transistor $Q_1$ and, in the event of a reverse voltage connected across the transistor, could damage the device. The second resistor $R_{N+}$ prevents this damage by disposing a resistance in this current path provided by the parasitic diode.

The possible damage results from the creation of a PN junction relationship caused by the doping of N conductivity type material with $P^+$ conductivity type material in order to form the shunt resistor $R_p$. This junction relationship creates a parasitic diode that provides a current path between the emitter and collector terminals of a shunt phototransistor. In order to prevent damage that might occur during a reverse voltage connection, the second resistor $R_{N+}$ is coupled between the emitter of transistor $Q_1$ and the first resistor $R_p$. The second resistor $R_{N+}$ is in series with the junction relationship resulting from the structure used to form the first resistor $R_p$, and therefore, serves to limit the current flowing between the emitter and collector terminals of the shunt transistor under reversed bias conditions.

An example embodiment of the present invention including a shunt phototransistor with reverse bias protection can create a more robust sensor by preventing damage that would otherwise be caused by a reverse voltage placed across the collector and emitter of the phototransistor.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A reflective optical sensor for sensing the presence of an object comprising:
 a reflective sensor package made of a resilient plastic material comprising:
  a first cavity including two opposing outwardly sloped sidewalls; and
  a second cavity including two opposing outwardly sloped sidewalls, the second cavity located next to the first cavity in the sensor package such that a physical barrier is disposed between the first and second cavities, wherein the physical barrier becomes gradually thinner between the openings of the first and second cavities toward the openings of the first and second cavities due to the outwardly sloped sidewalls of the first and second cavities, wherein the first and second cavities are only partially filled with an at least partially transparent resin;

a VCSEL located within the first cavity for producing an optical emission;

a shunt phototransistor including reverse bias protection located within the second cavity configured to receive at least a portion of the produced optical emission reflected off of the object, the shunt phototransistor including reverse bias protection comprising:

an emitter;

a collector;

a base;

a diode including an anode and a cathode, the anode being electrically coupled with the base, and the cathode being electrically coupled with the collector;

a shunt internal resistor electrically coupled between the anode and the emitter creating a PN junction relationship, the PN junction relationship being disposed in parallel electrical relationship with the diode and the first resistor; and a reverse bias protection internal resistor coupled in electrical communication between the first resistor and the emitter.

2. The reflective optical sensor of claim 1, wherein the shunt phototransistor includes low light level rejection at a predetermined knee point.

3. The reflective optical sensor of claim 1, wherein the shunt phototransistor has a predetermined light current slope.

4. The reflective optical sensor of claim 1, further comprising: a first electrical contact electrically coupled to the VCSEL; a second electrical contact electrically coupled to the VCSEL; a third electrical contact electrically coupled to the shunt phototransistor; and a fourth electrical contact electrically coupled to the shunt phototransistor.

5. A reflective optical sensor according to claim 1, further comprising: a first electrical contact electrically coupled to the VCSEL; a second electrical contact electrically coupled to the VCSEL; a third electrical contact electrically coupled to the shunt phototransistor; a fourth electrical contact electrically coupled to the shunt phototransistor; and the least partially transparent resin filling the first cavity and the second cavity allowing optical transmission to the shunt phototransistor and from the VCSEL.

6. The reflective optical sensor of claim 1, wherein the optical emission is unfocused as it is transmitted from the VCSEL, reflected by the object, and received by the shunt phototransistor.

7. The reflective optical sensor of claim 1, wherein the reflective optical sensor does not include a focusing lens.

8. The reflective optical sensor of claim 1, wherein the VCSEL creates an emission having an angular emission window of about 20-30 degrees.

9. The reflective optical sensor of claim 1, wherein the reflective optical sensor is at least as small as 3 millimeters or smaller.

10. The reflective optical sensor of claim 1, further comprising an array of VCSELs for producing optical emissions.

11. The reflective optical sensor of claim 1, wherein the first cavity surrounds the VCSEL on five sides of the VCSEL, and wherein the second cavity surrounds the shunt phototransistor on five sides of the shunt phototransistor.

12. The reflective optical sensor of claim 1, wherein the emission from the VCSEL is produced at an angle to a top surface of the reflective optical sensor.

13. The reflective optical sensor of claim 12, wherein the angle is determined based on a particular application of the reflective optical sensor.

14. The reflective optical sensor of claim 12, wherein the angle is determined based on a distance between the reflective sensor and the object.

* * * * *